United States Patent [19]

Hulderman

[11] Patent Number: 5,486,832
[45] Date of Patent: Jan. 23, 1996

[54] RF SENSOR AND RADAR FOR AUTOMOTIVE SPEED AND COLLISION AVOIDANCE APPLICATIONS

[75] Inventor: Garry N. Hulderman, Riverside, Calif.

[73] Assignee: Hughes Missile Systems Company, Los Angeles, Calif.

[21] Appl. No.: 269,729

[22] Filed: Jul. 1, 1994

[51] Int. Cl.[6] .................................................. G01S 13/91
[52] U.S. Cl. .............................. 342/70; 342/175; 342/374
[58] Field of Search .................................. 342/70–72, 59, 342/109, 175, 374; 250/332; 343/754, 795

[56] References Cited

U.S. PATENT DOCUMENTS

| | | | |
|---|---|---|---|
| 4,107,692 | 8/1978 | Hutcheon | 343/754 |
| 4,150,375 | 4/1979 | Ross et al. | 342/71 |
| 5,008,678 | 4/1991 | Herman | 342/70 |
| 5,014,063 | 5/1991 | Studenny | 342/109 |
| 5,202,692 | 4/1993 | Huguenin et al. | 342/179 |
| 5,227,800 | 7/1993 | Huguenin | 342/179 |
| 5,248,977 | 9/1993 | Lee et al. | 342/175 |
| 5,351,077 | 9/1994 | Lee et al. | 342/35 |

Primary Examiner—Harold J. Tudor
Attorney, Agent, or Firm—Charles D. Brown; Randall M. Heald; Wanda K. Denson-Low

[57] ABSTRACT

Radar apparatus that includes a millimeter wave radar transmitter comprising a flood beam antenna, and a radar signal processor for processing radar return signals to produce radar output signals. An RF sensor comprising a receive antenna includes a plurality of antenna elements, a plurality of respectively coupled to outputs of the plurality of antenna elements and coupled to the transmitter by means of a coupler, a plurality of filter circuits respectively coupled to outputs of the plurality of mixers, a multiplexer coupled to outputs of the plurality of filter circuits that comprises as a multiple input, single output switch for sequentially outputting video signals derived from radar signals received by each of the receive antenna elements, and a lens for imaging radar returns onto each of the plurality of antenna elements. The heart of the present invention is a heterodyne receive antenna that may be used in many applications, including radiometric or radar applications, and the like. The present invention provides for a 35–300 GHz millimeter wave electronic scanning sensor for use in collision avoidance applications, and the like.

16 Claims, 4 Drawing Sheets

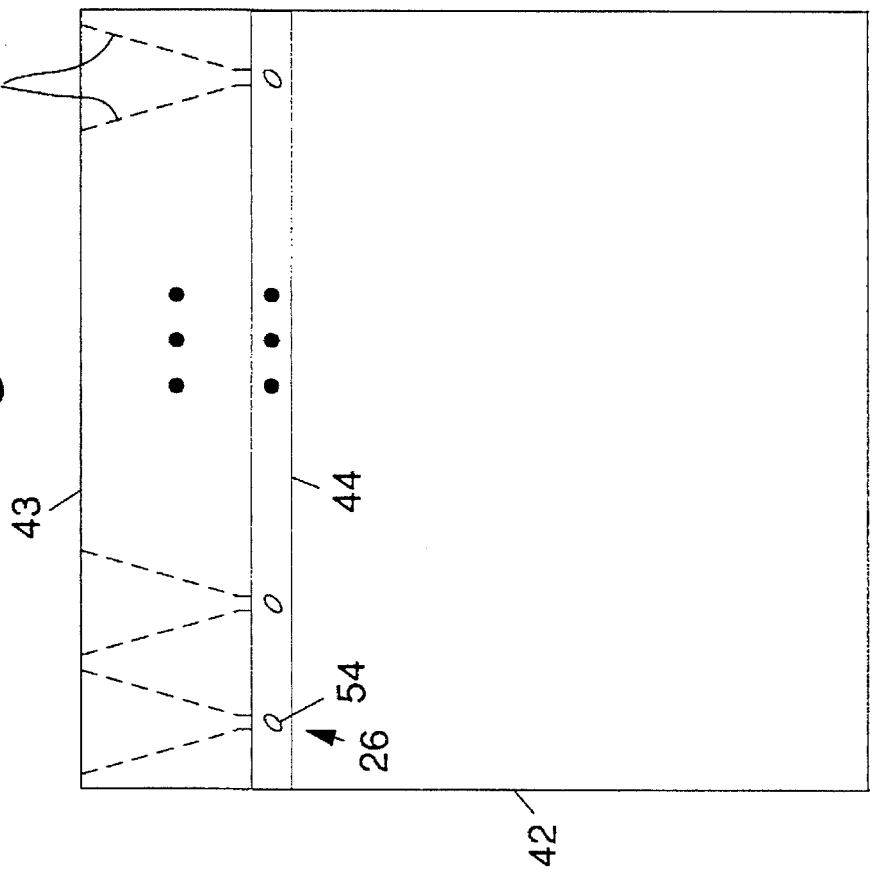
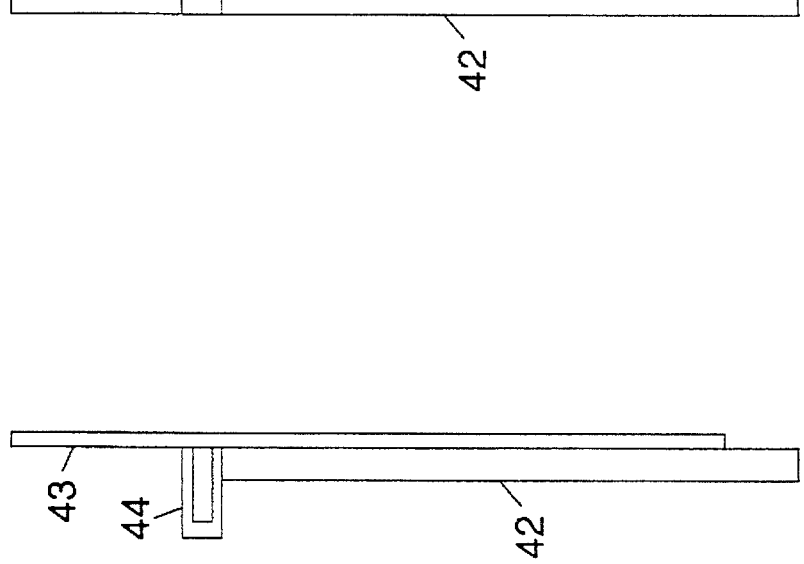

RF SENSOR AND RADAR FOR AUTOMOTIVE SPEED AND COLLISION AVOIDANCE APPLICATIONS

BACKGROUND

The present invention relates to heterodyne millimeter wave radar systems, and more particularly, to a low cost collision avoidance sensor and radar for use in automotive speed and collision avoidance systems.

The assignee of the present invention develops automotive cruise control and collision avoidance systems, and the like. As a result of angular resolution requirements and antenna size limitations, development relating to automotive cruise control and collision avoidance applications has been performed in the 75 to 95 GHz frequency band. Due to the maturity of the technology used at these shorter wavelengths, the majority of the system hardware at these wavelengths uses conventional waveguide transmission and cavity techniques.

However, waveguide components, manufactured in any form, are limited in how inexpensively they can be produced in high volume production. In addition, given the requirements for less than 2 degree resolution and 30 degree azimuth coverage, heretofore, a narrow beam mechanically scanned antenna has been the only available option. For many reasons a gimbled flapping (mechanically scanned) antenna does not provide an optimum solution.

Another approach that might be adapted for use in the 75 to 95 GHz frequency band, seldom mentioned due to the present state-of-the-art, is a slotted waveguide phased array antenna. This antenna, with its electronically scanned beam capability, works well at lower frequencies, but has a number of limitations in the 75 to 95 GHz band. These limitations include degraded electrical performance and very high cost even in high production quantities.

Therefore, it is an objective of the present invention to provide for a heterodyne millimeter wave radar system employing a low cost sensor, or RF camera, for use in automotive speed and collision avoidance systems, and the like.

SUMMARY OF THE INVENTION

In order to meet the above and other objectives, the present invention employs a heterodyne receiver antenna array that may be used in scanning applications including radiometric or radar applications, and the like. More specifically, the present invention provides for a 35–300 GHz millimeter wave electronic scanning array or sensor for use in collision avoidance applications, and the like. The present invention provides the capability of a conventional mechanically scanned system at a fraction of the cost.

One embodiment of the present invention comprises a radar that includes a millimeter wave radar transmitter having a flood beam antenna, and a radar signal processor for processing radar return signals to produce radar output signals. An RF sensor in accordance with the present invention is provided that comprises a receive antenna is coupled to the radar signal processor and includes a plurality of antenna elements, a plurality of mixers respectively coupled to outputs of the plurality of antenna elements and to the transmitter by means of a coupler, a plurality of filter circuits respectively coupled to outputs of the plurality of mixers, a multiplexer coupled to outputs of the plurality of filter circuits that comprises as a multiple input, single output switch for sequentially outputting video signals derived from radar signals received by each of the receive antenna elements, and a lens for imaging radar returns onto each of the plurality of antenna elements.

More particularly, the radar includes an FMCW transmitter, the radar signal processor and the RF sensor. The FMCW transmitter comprises a reference oscillator, a waveform control circuit, a Gunn transmitter that comprises a transmitter and mixer local oscillator for FMCW radar energy transmission, and as a mixer local oscillator for radar energy reception, a beam selector circuit, a harmonic mixer coupled to the Gunn transmitter and to the waveform control circuit, and the flood beam antenna.

The radar signal processor comprises an amplifier, a video blanking circuit coupled to the amplifier, an analog to digital (A/D) converter coupled to the video blanking circuit, a range/Doppler processor coupled to the analog to digital (A/D) converter, a detect/tracking processor coupled to the range/Doppler processor, a display coupled to the detect/tracking processor, and a master timing reference coupled to the waveform control circuit, the beam selector circuit, the video blanking circuit, the analog to digital (A/D) converter, the range/Doppler processor, and the detect/tracking processor to control the timing of the signal flow therebetween.

The RF sensor comprises a receive antenna that includes a plurality of antenna elements, a plurality of mixers respectively coupled to outputs of the plurality of antenna elements and coupled to the Gunn transmitter by means of a coupler, a plurality of filter circuits respectively coupled to outputs of the plurality of mixers, a multiplexer coupled to outputs of the plurality of filter circuits that functions as a multiple input, single output switch for sequentially outputting video signals derived from radar signals received by the receive antenna elements, and a lens for imaging radar returns onto each of the plurality of antenna elements.

More specifically, each antenna element comprises a linearly tapered slot, a mixer diode coupled to the linearly tapered slot, a planer tuned backshort coupled to the mixer diode, an RF low pass filter coupled to the mixer diode, an amplifier coupled to the RF low pass filter, and an IF low pass filter coupled to the amplifier.

The RF sensor comprises a support tube, a pair of support members secured to the tube, a backing plate secured to the support members, a dielectric antenna element board secured to the support members and backing plate that comprises the antenna elements, and a slotted waveguide coupled to the backing plate and dielectric element board for coupling energy out of the antenna elements. Each antenna element may comprise a linearly tapered slot, a mixer diode coupled to the linearly tapered slot, and a planer tuned backshort coupled to the mixer diode.

The sensor includes two antennas, one for transmission (1.6 inches×0.18 inches) and one for reception (5 inches in diameter), and operates at 91 GHz. The transmit antenna has a beamwidth of 35 degrees in azimuth illuminating a 55 meter sector in front of a vehicle and a 100 meter range) and 6 degrees in elevation. The receive antenna comprises a quasioptical focal plane line array, which, with a simple lens shape, provides 16 independent simultaneous overlapping 1.8 degree beams, with a field-of-view of 30 degrees across the azimuth plane. By using optical techniques at the image plane of the lens antenna, it has been possible to incorporate, using printed circuits, the individual integrated (feed-mixer/LO coupler) elements to generate a fully sampled array (1 beamwidth separation). The beam position selection for the sensor is done at the IF frequency output of the individual elements.

The present invention provides for a very low cost automotive collision avoidance sensor, or RF camera. The present invention provides a very low cost approach to achieving high angle resolution, adequate field-of-view, low loss, and an efficient non-mechanical scanning solution to the automotive collision avoidance problem. As example, the material and labor costs to construct the lens/16 element portion of the first proof-of-principle model was 300 dollars (excluding mixer diodes).

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which:

FIGS. 3a, 3b and 3c show top, side and bottom views, respectively, of individual antenna elements of the receive antenna of FIG. 1.

DETAILED DESCRIPTION

Figure 1:
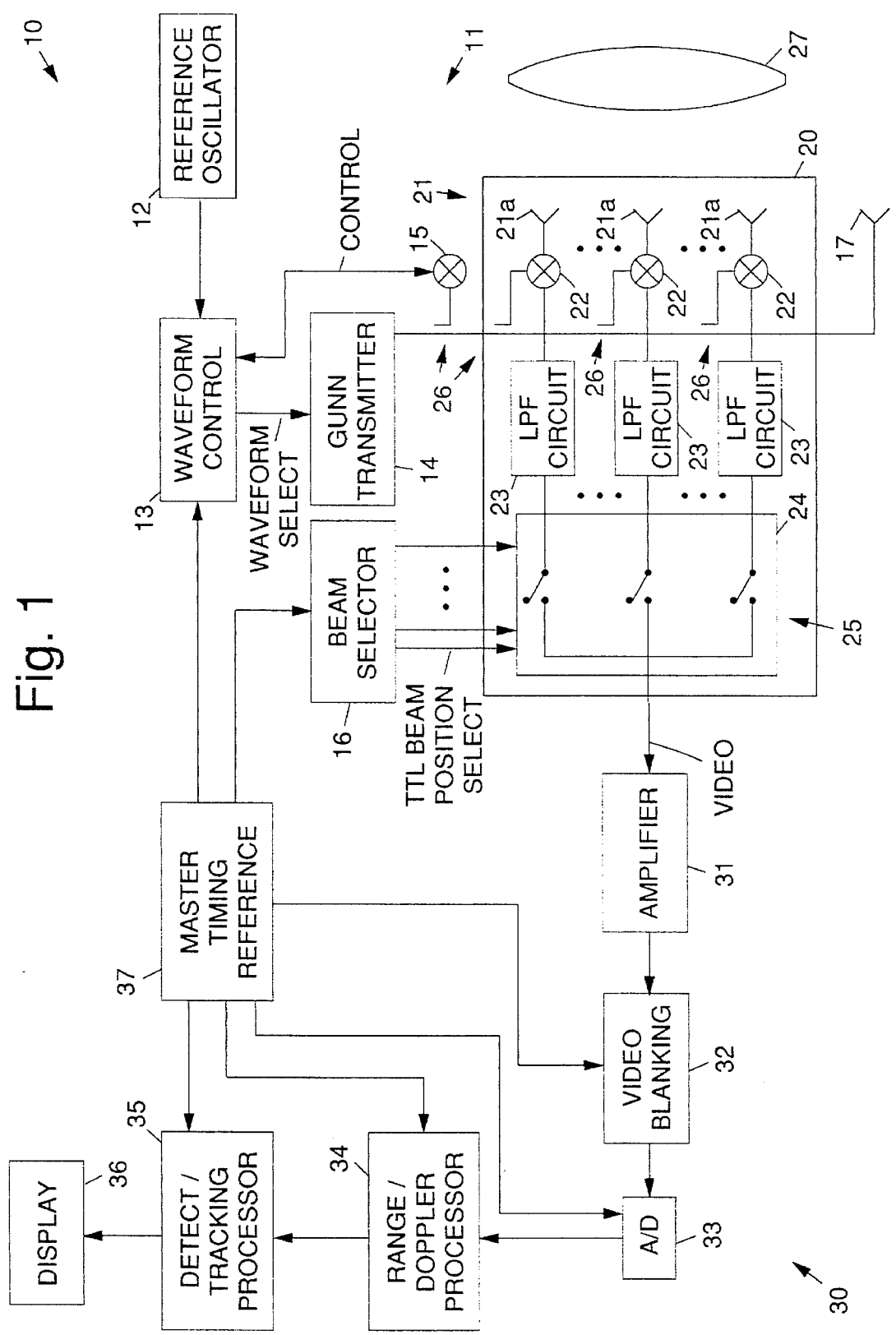
FIG. 1 is a block diagram of an automotive-speed control and collision avoidance system employing an RF sensor or camera in accordance with the principles of the present invention.

Referring to the drawing figures, FIG. 1 is a block diagram of an automotive-speed control and collision avoidance system 10 or radar system 10, employing an RF sensor 20, or camera 20, in accordance with the principles of the present invention. FIG. 1 illustrates a system block diagram of a proof-of-principle model of the RF sensor 20. The approach implemented in the present invention extends well-understood optical techniques to longer (1000X) millimeter wavelengths, and employs a low cost fabrication technique to produce printed array elements employed in the sensor 20.

The system 10 is comprised of an FMCW transmitter 11 that includes a reference oscillator 12, a waveform control circuit 13, a Gunn transmitter 14, a beam selector circuit 16, a harmonic mixer 15, and a flood beam antenna 17. These components are interconnected in a conventional manner as is illustrated in FIG. 1. The Gunn transmitter 14 is used in a conventional manner as a transmitter and mixer local oscillator for FMCW radar energy transmission. The Gunn transmitter 14 is also used in a conventional manner as a mixer local oscillator only, without the use of the flood beam antenna 17, for receiver applications.

The RF sensor 20 comprises a receiver 21, or receive antenna 21, that includes a plurality of antenna elements 21a. Each of the antenna elements 21a are coupled by way of a mixer 22 through a filter circuit 23 to a multiplexer 24. The multiplexer 24 functions as a multiple input, single output switch 25 that is controlled by means of the beam selector circuit 16 to selectively and sequentially outputting video signals derived from radar signals received by the receive antenna 21. Each of the mixers 22 is coupled to the Gunn transmitter 14 by means of a coupler 26, as is the harmonic mixer 15. A lens 27 is provided that is used to image radar returns from an image scene onto each of the plurality of antenna elements 21a of the receive antenna 21.

The output of the multiplexer 24 is coupled to a radar signal processor 30 that includes an amplifier 31 coupled through a video blanking circuit 32 and an analog to digital (A/D) converter 33 to a range/Doppler processor 34. The output of the range/Doppler processor 34 is coupled to a detect/tracking processor 35 whose output is coupled to a display 36, for example. A master timing reference 37 is coupled to the waveform control circuit 13, the beam selector circuit 16, the video blanking circuit 32, the analog to digital (A/D) converter 33, the range/Doppler processor 34, and the detect/tracking processor 35 to control the timing of the signal flow between the various components of the system 10.

Figure 2:
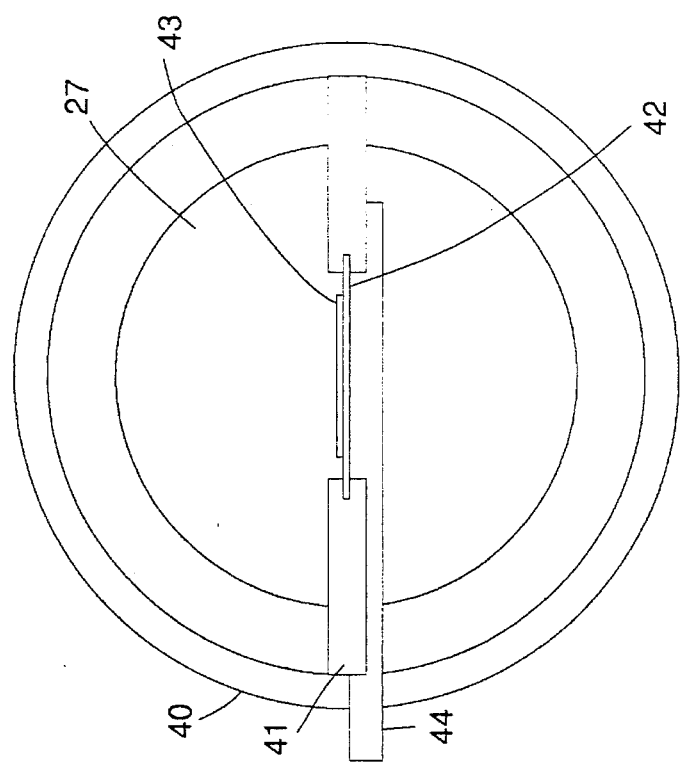
FIG. 2 shows a rear view of the receive antenna of the system of FIG. 1.

A more detailed description of the RF sensor 20 is given below with reference to FIGS. 2 and 3a–3c. Details of the receive antenna 21 are shown in FIG. 2, which shows a rear view of the receive antenna 21 of the system 10 of FIG. 1. The lens 27 employed in the receive antenna 21 comprises a 5.2 inch diameter polystyrene (n=1.6) plano-convex lens 27 with an f/D=1.2. The lens 27 is housed in a support tube 40. A pair of support members 41 are secured to the tube 40 which secure a backing plate 42 onto which is disposed a Kapton element board 43 that comprises the antenna elements 21a. A slotted waveguide 44 comprising a plurality of coupling slots 54 (corresponding to the couplers 26 in FIG. 1) is coupled to the backing plate 42 and Kapton element board 43 that is used to couple energy out of the antenna elements 21a. The coupling slots 54 are formed by etching a copper film that forms a wall of the waveguide 44.

Figure 3A:
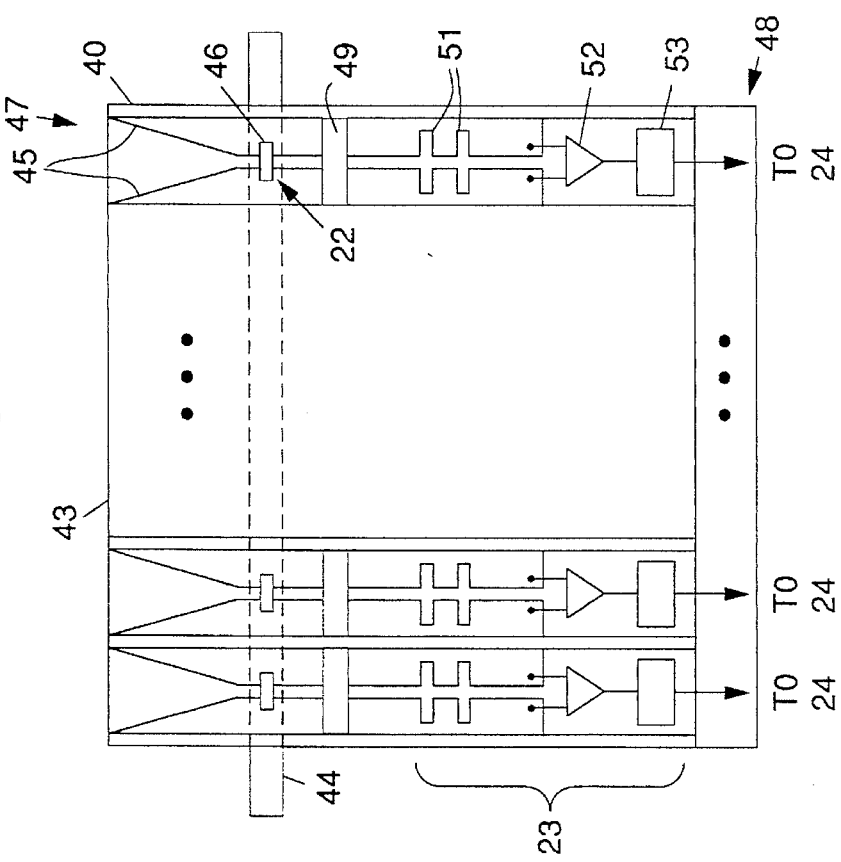

Individual antenna elements 21a are comprised of a linearly tapered slot 47, a mixer diode 46, a planer tuned backshort 49, an RF low pass filter 51, an amplifier 52, an IF low pass filter 53, and a local oscillator coupling 48, the details of which are shown in FIGS. 3a–3c. More particularly, FIGS. 3a, 3b and 3c show top, side and bottom views, respectively, of the receive antenna 21 of FIG. 1. The circuit elements shown in FIGS. 3a–3c are generally well known in the art.

A 10 dB illumination taper on the lens 27 is accomplished by using a 0.12 inch slot antenna aperture. This offsets the elements 21a in their physical position from its axial center by 0.75 of the half power beamwidth while allowing them to fully sample the focal plane. At approximately the apex of the tapered slot antenna elements 21a, a GaAs Schottky mixer diode 46 is bonded to two fins 45 of each antenna element 21a. This provides a transition for received RF energy to the impedance of the mixer diode 46. The slot width at the base of the fins 45 is 0.005 inches and serves as a transmission line for the energy not absorbed by the mixer diode 46. The planer tuned back-short 49 is positioned at a location that reflects the energy in proper phase back to the mixer diode 46.

The antenna elements 21a are printed on a sheet of 0.001 inch thick Kapton dielectric element board 43 with 0.5 ounce copper. The size of the sheet comprising dielectric element board 43 is 2.6 inches×0.75 inches. The element board 43 is registered and bonded using silver epoxy adhesive to the narrow wall of the slotted waveguide 44. The H-plane dimensions of the slotted waveguide 44 are made such that the separation between slots 47 of the slotted waveguide 44 is one wavelength in the waveguide and coincides with the transmission line separation. The angle of the waveguide slots 47 varies to maintain constant output over the length of the slotted waveguide 44. This energy couples through the 0.001 inch thick Kapton dielectric element board 43 into the mixer diodes 46 and serves as the local oscillator. The remaining energy is transmitted into space by way of the flood beam antenna 17.

There are several options available in selecting the beam position at IF outputs 48 of the antenna elements 21a. The proof of principle model uses a single pole 16 throw switch 25, or multiplexer 24, to connect a desired antenna element 21a to the amplifier 31. Another option may include gain and integration circuitry (provided by the amplifier 52 and IF low pass filter 53) as part of each element so that energy is not lost during IF scanning.

Figure 4:
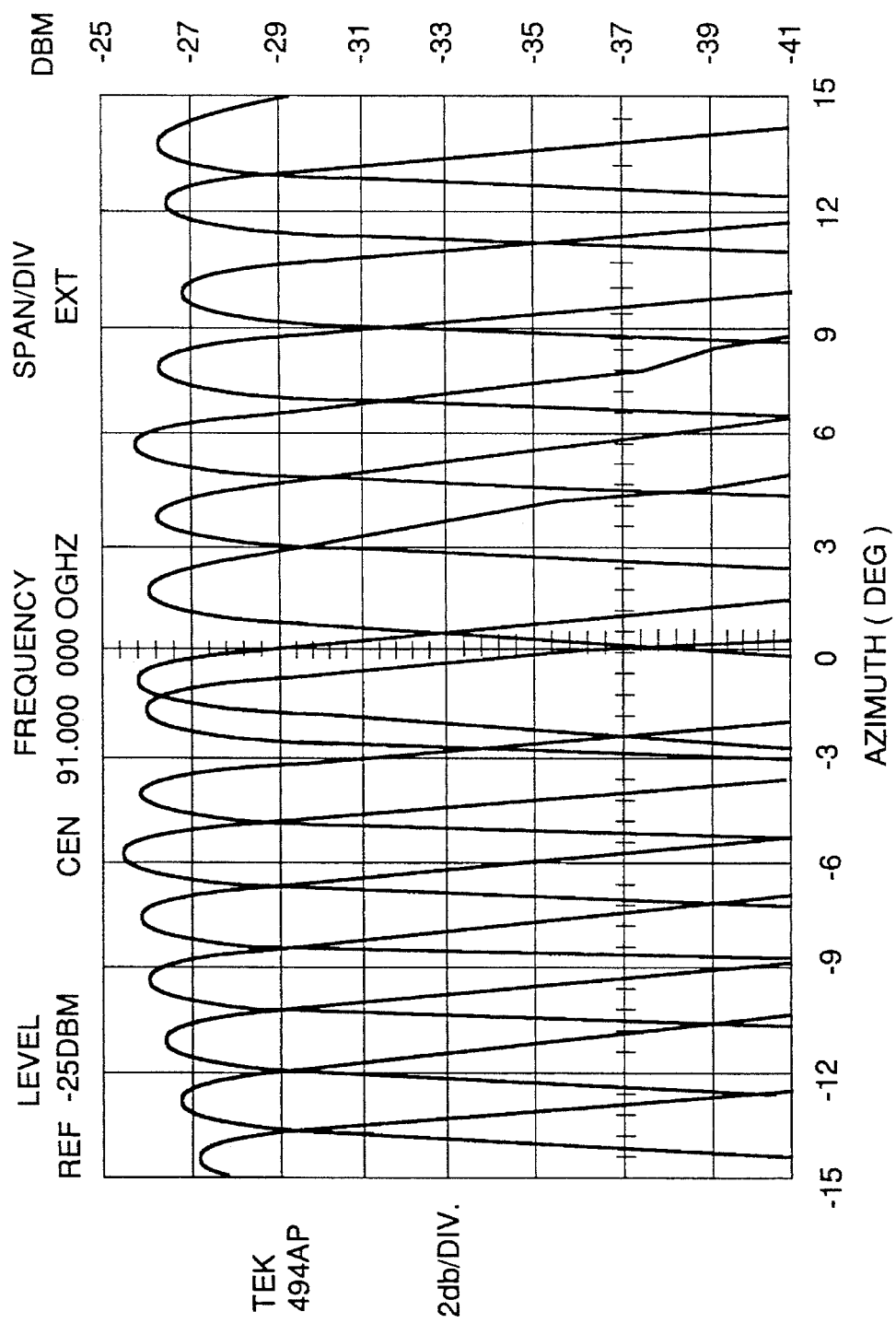
FIG. 4 shows that for 16 superimposed 1.8° beamwidth element outputs over a 29° FOV, the return energy is changed in angle for the system of FIG. 1.

Tests were conducted on the proof-of-principle system 10 to demonstrate line array operation. The elements 21a were spaced 0.17 inches, or one beamwidth, apart. FIG. 4 shows that for 16 superimposed 1.8° beamwidth antenna element outputs over a 29 FOV, the return energy is changed in angle.

The sensor 20 includes two antennas 17, 21, the transmit antenna 17 (1.6 inches×0.18 inches) and the receive antenna 21 (5 inches in diameter), and operates at 91 GHz. The transmit antenna 17 has a beamwidth of 35 degrees in azimuth (illuminating a 55 meter sector in front of a vehicle, for example, on which it is disposed) at a 100 meter range and 6 degrees in elevation. The receive antenna 21 uses the quasioptical focal plane line array of antenna elements 21a, which, in conjunction with a simple shape lens 27, provides 16 independent simultaneous overlapping 1.8 degree beams, with a field-of-view of 30 degrees across the azimuth plane. By using optical techniques, at the image plane of the receive antenna 21, the present sensor 20 incorporates on printed circuits (the element board 43), the individual integrated (feed-mixer/LO coupler) elements 21a that generate a fully sampled array (1 beamwidth separation). The beam position selection for the sensor 20 is done at the IF frequency output 48 of the individual elements 21a.

The present invention provides a very low cost approach for providing a sensor with high angle resolution, adequate field-of-view, low loss, and an efficient non-mechanical scanning solution for the automotive speed and collision avoidance applications. By way of example, the material and labor costs to construct the lens 27 and 16 antenna elements 21a of the proof-of-principle model of the sensor 20 was 300 dollars, excluding mixer diodes 46.

As discussed above, the RF sensor 20 was developed for automatic collision avoidance applications where high angular resolution, a large FOV in the azimuth plane, and a single beam in elevation are required. For application requiring a two axis antenna array the element boards 43 may be stacked to produce a 16×16 array. Furthermore, while the above-described embodiment employs a 16 element array, the sensor 20 of the present invention may be readily expanded to employ an antenna 21 having 20 elements 21a, for example. Consequently, the present invention is not limited in the number of antenna elements 21a comprising the single plane array. The larger array provides for a larger field of view, and The heart of the present invention is a heterodyne receiver array (the receive antenna 21) that may be used in many applications, including radiometric or radar applications, and the like. The present invention provides for a 35–300 GHz millimeter wave electronic scanning array or sensor 20 for use in collision avoidance applications, and the like. The present invention provides the capability of a conventional mechanically scanned system.

Thus there has been described a new and improved collision avoidance sensor for use in such automotive speed and collision avoidance systems. It is to be understood that the above-described embodiment is merely illustrative of some of the many specific embodiments that represent applications of the principles of the present invention. Clearly, numerous and other arrangements can be readily devised by those skilled in the art without departing from the scope of the invention.

What is claimed is:

1. Radar apparatus comprising:
   a millimeter wave FMCW radar transmitter comprising a single flood beam antenna;
   a radar signal processor for processing radar return signals to produce radar output signals; and
   an RF sensor comprising a receive antenna that includes:
      a plurality of antenna elements;
      a plurality of mixers respectively coupled to outputs of the plurality of antenna elements and coupled to the transmitter by means of a coupler;
      a plurality of filter circuits respectively coupled to outputs of the plurality of mixers;
      a multiplexer coupled to outputs of the plurality of filter circuits that comprises a multiple input, single output switch for sequentially outputting video signals derived from radar signals received by each of the receive antenna elements, and wherein the single output of the multiplexer is coupled to the radar signal processor for providing the radar return signals thereto; and
      a lens for imaging radar returns onto each of the plurality of antenna elements.

2. The apparatus of claim 1 wherein:
   the millimeter wave FMCW radar transmitter comprises:
      a reference oscillator;
      a waveform control circuit coupled to the reference oscillator;
      a Gunn transmitter coupled to the waveform control circuit that comprises a transmitter and mixer local oscillator for FMCW radar energy transmission, and a mixer local oscillator for radar energy reception;
      a beam selector circuit coupled to said multiplexer; and
      a harmonic mixer coupled to the Gunn transmitter and to the waveform control circuit;
   and wherein the radar signal processor comprises:
      an amplifier having an input coupled to the single output of the multiplexer;
      a video blanking circuit coupled to the amplifier;
      an analog to digital (A/D) converter coupled to the video blanking circuit;
      a range/Doppler processor coupled to the analog to digital (A/D) converter;
      a detect/tracking processor coupled to the range/Doppler processor;
      a display coupled to the detect/tracking processor; and
      a master timing reference coupled to the waveform control circuit, the beam selector circuit, the video blanking circuit, the analog to digital (A/D) converter, the range/Doppler processor, and the detect/tracking processor to control the timing of the signal flow therebetween.

3. The apparatus of claim 2 wherein the lens comprises polystyrene.

4. The apparatus of claim 3 wherein the lens has an f/D=1.2.

5. The apparatus of claim 2 wherein the lens has a 10 dB illumination taper.

6. The apparatus of claim 1 wherein the RF sensor comprises:

a support tube;

a pair of support members secured to the tube;

a backing plate secured to the support members;

a dielectric antenna element board secured to the support members and backing plate that comprises the antenna elements; and a slotted waveguide coupled to the backing plate, the dielectric element board, and the transmitter, for coupling energy out of the antenna elements.

7. The apparatus of claim 6 wherein each antenna element board comprises:

a linearly tapered slot;

a mixer diode coupled to the linearly tapered slot;

a planer tuned backshort coupled to the mixer diode;

an RF low pass filter coupled to the mixer diode;

an amplifier coupled to the RF low pass filter;

an IF low pass filter coupled to the amplifier; and a waveguide slot adjacent the mixer diode.

8. The apparatus of claim 7 wherein the slot taper offsets the physical position of the element from an axial center by 0.75 of the half power beamwidth while allowing it to fully sample its focal plane.

9. The apparatus of claim 7 wherein the mixer diode is disposed at approximately the apex of the tapered slot antenna elements.

10. The apparatus of claim 9 wherein the mixer diode comprises a GaAs Schottky mixer diode bonded to two fins of the antenna element.

11. The apparatus of claim 10 wherein the slot width at the base of the fins is 0.005 inches and provides a transmission line for the energy not absorbed by the mixer diode.

12. The apparatus of claim 7 wherein the planer tuned backshort is positioned at a location that reflects energy in proper phase back to the mixer diode.

13. The apparatus of claim 7 wherein the element board is registered and bonded using adhesive to a wall of a slotted waveguide coupled to the mixer diode.

14. The apparatus of claim 13 wherein H-plane dimensions of the slotted waveguide are such that the separation between slots of the slotted waveguide is one wavelength in the waveguide and coincides with the transmission line separation.

15. The apparatus of claim 14 wherein the angle of waveguide slots of the slotted waveguide varies to maintain constant output over the length thereof.

16. Radar apparatus comprising:

an FMCW transmitter comprising:

a reference oscillator;

a waveform control circuit coupled to the reference oscillator;

a Gunn transmitter coupled to the waveform control circuit that comprises a transmitter and mixer local oscillator for FMCW radar energy transmission, and a mixer local oscillator for radar energy reception;

a beam selector circuit;

a harmonic mixer coupled to the Gunn transmitter and to the waveform control circuit; and a single flood beam antenna;

a radar signal processor comprising:

an amplifier;

a video blanking circuit coupled to the amplifier;

an analog to digital (A/D) converter coupled to the video blanking circuit;

a range/Doppler processor coupled to the analog to digital (A/D) converter;

a detect/tracking processor coupled to the range/Doppler processor;

a display coupled to the detect/tracking processor; and a master timing reference coupled to the waveform control circuit, the beam selector circuit, the video blanking circuit, the analog to digital (A/D) converter, the range/Doppler processor, and the detect/tracking processor to control the timing of the signal flow therebetween; and an RF sensor comprising a receive antenna that includes:

a plurality of antenna elements;

a plurality of mixers respectively coupled to outputs of the plurality of antenna elements and coupled to the Gunn transmitter by means of a coupler;

a plurality of filter circuits respectively coupled to outputs of the plurality of mixers;

a multiplexer having an output coupled to an input of the amplifier and coupled to outputs of the plurality of filter circuits that comprises as a multiple input, single output switch for sequentially outputting video signals derived from radar signals received by the receive antenna elements, said beam selector coupled to said multiplexer; and a lens for imaging radar returns onto each of the plurality of antenna elements.

* * * * *